United States Patent [19]
Fusegawa et al.

[11] Patent Number: 5,725,661
[45] Date of Patent: Mar. 10, 1998

[54] EQUIPMENT FOR PRODUCING SILICON SINGLE CRYSTALS

[75] Inventors: Izumi Fusegawa; Toshiro Hayashi; Tomohiko Ohta; Masayuki Arai, all of Fukushima-ken, Japan

[73] Assignee: Shin-Etsu Handotai Co., Ltd., Tokyo, Japan

[21] Appl. No.: 699,719

[22] Filed: Jul. 1, 1996

[30] Foreign Application Priority Data

Jul. 4, 1995 [JP] Japan ..................... 7-191086

[51] Int. Cl.⁶ .......................................... C30B 35/00
[52] U.S. Cl. ................... 117/202; 117/30; 117/200; 117/917
[58] Field of Search ................. 117/30, 32, 200, 117/201, 202, 217, 917

[56] References Cited

U.S. PATENT DOCUMENTS

| | | | |
|---|---|---|---|
| 4,318,769 | 3/1982 | Sachs | 117/14 |
| 4,565,671 | 1/1986 | Matsutani et al. | 117/217 |
| 4,622,211 | 11/1986 | Suzuki et al. | 117/217 |
| 4,830,703 | 5/1989 | Matsutani | 117/217 |
| 4,847,052 | 7/1989 | Takasu et al. | 117/217 |
| 4,849,188 | 7/1989 | Takasu et al. | 117/217 |
| 5,178,720 | 1/1993 | Frederick | 117/20 |

FOREIGN PATENT DOCUMENTS

A-60-033296  2/1985  Japan .
8908731  9/1989  United Kingdom ............... 117/201

OTHER PUBLICATIONS

JP J.Industrial Health, Nakagawa: "electromagnetic fields: their biological effects & regulation", 1991.

*Primary Examiner*—Felisa Garrett
*Attorney, Agent, or Firm*—Ronald R. Snider

[57] ABSTRACT

An equipment for producing silicon single crystals based on an MCZ method, which enables an operator to be protected from dangerous exposure to magnetic field without involving increase in the size of the silicon single crystal production equipment. In the silicon single crystal production equipment based on the MCZ method, a growth furnace control apparatus for control of a pulling apparatus is located away from the pulling apparatus by a predetermined distance so that the intensity of magnetic field immediately close to the growth furnace control apparatus can become 300 gausses or less. A monitoring camera for observing the growing condition of the silicon single crystal is mounted to a window 5a of a growth furnace to be operatively connected to a monitor of the growth furnace control apparatus and to cause the growth furnace control apparatus to control the pulling apparatus on a remote control basis. In an experimental example, an accumulated magnetic field exposure value immediately close to the growth furnace control apparatus can be suppressed to less than 30% of its allowable maximum value and therefore the operator can continuously work highly safely.

2 Claims, 2 Drawing Sheets

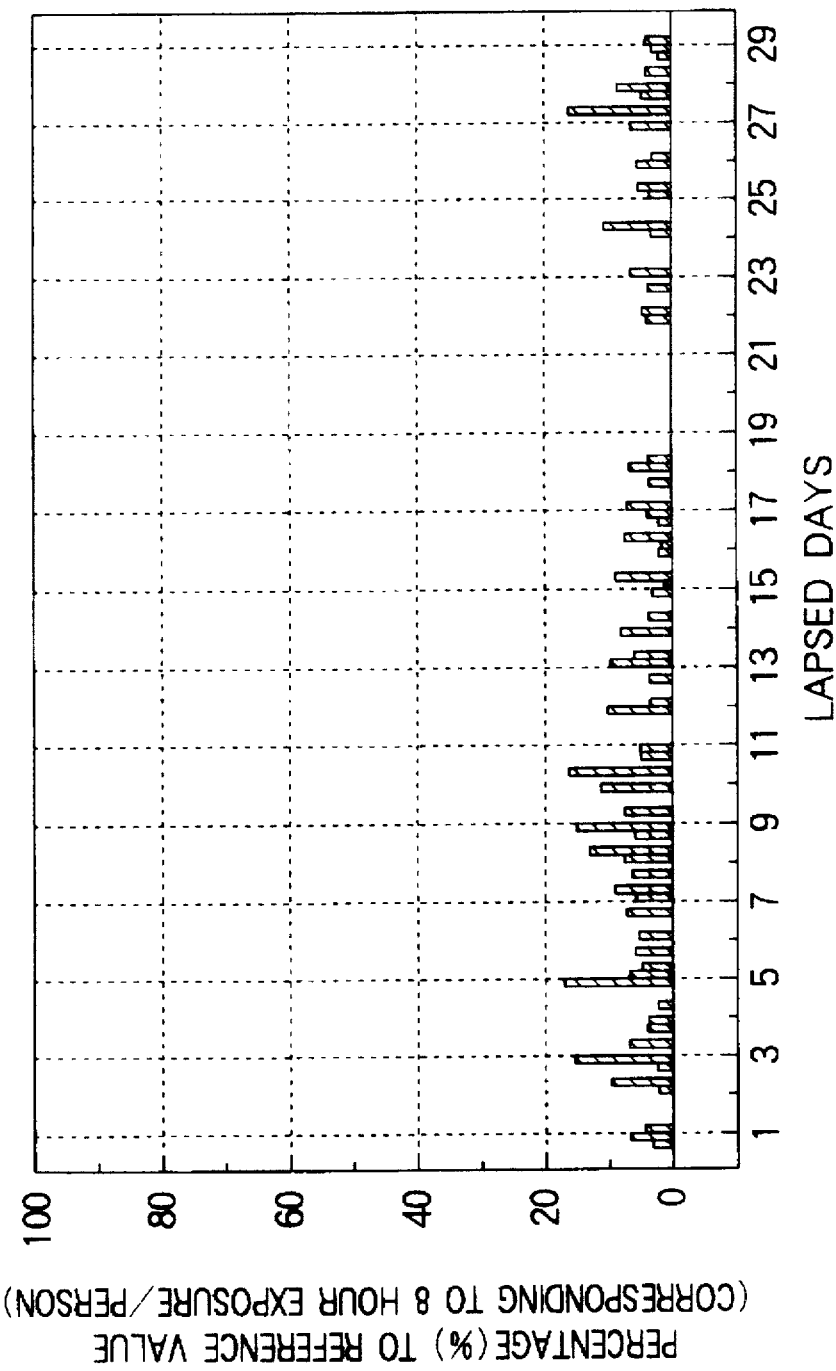

EQUIPMENT FOR PRODUCING SILICON SINGLE CRYSTALS

The present disclosure relates to subject matter contained in Japanese patent application No. 191086 (filed on Jul. 4, 1995) which is expressly incorporated herein by reference in its entirety.

BACKGROUND OF THE INVENTION

1. Field of the Invention

The present invention relates to an equipment for producing silicon single crystals based on a magnetic field applied Czochralski method (which will be referred merely as the MCZ method, hereinafter) in which silicon melt contained in a crucible of a Czochralski-method-based puller is subjected to a pulling process during application of a magnetic field to the silicon melt to obtain a silicon single crystal.

2. Description of the Related Art

It is well known that, when a silicon single crystal is grown based on a Czochralski method (referred to simply as the CZ method, hereinafter), thermal convection or vibration of silicon melt causes the once-grown silicon single crystal to be locally re-melted into the melt or oxygen dissolved from a quartz crucible to be irregularly entrapped into the crystal during the growth process, which undesirably results in generation of crystal defects or striation in the resultant crystal.

For a method for pulling a silicon single crystal from silicon melt while controllably suppressing thermal convection or vibration, there has been suggested an MCZ method in which a magnetic field is applied to the silicon melt. Detailed examples of this method are disclosed in Japanese Patent Laid Open Publication No. 56-104791 and so on, to show the effectiveness of the method. Further, as the increased diameter of silicon single crystals are recently developed (refer to a magazine entitled "Nikkei Microdevice", November, 1992), a larger size of silicon single crystal producing equipment has been strongly demanded. To this end, the employment of a small-size, light-weight superconductivity type magnet has been studied for a magnetic field generating apparatus for use in the MCZ method. A detailed example of such a type of magnetic field generating apparatus is disclosed in Japanese Patent Laid-Open Publication No. 60-36391.

Meanwhile, with regard to the influences of high-intensity magnetic field upon living human body, there are many unclear points as of now. Safety guidelines for protecting human body located in electrostatic magnetic field from the dangerous electrostatic magnetic field are described, for example, in a literature ACGIH (American Conference of Governmental Industrial Hygienists, 1991, PA-51) published in U.S. or in a journal published in Japan and entitled "Industrial Health", Nakagawa, Jpn J, 1991, 33, pp. 359–371). These literatures state that, when a human body is placed in a magnetic field environment for 8 hours, the upper limit of intensity of the magnetic field which can have no adverse effect on the human body is 500 or 600 gausses.

Such a superconductivity type magnetic field generating apparatus as mentioned above, however, has had a problem that the apparatus, which tends to have major leaks of its magnetic field into the outside of the apparatus and in the vicinity of the apparatus, cannot satisfy safety criteria specified in the above safety guidelines, demanding that the intensity of magnetic field be less than about 600 gausses. To solve this problem, it is considered to employ such an normal conductivity type magnetic field generating apparatus that forms a magnetic circuit to provide less external magnetic field leakage. However, the normal conductivity type magnetic field generating apparatus, which becomes very large in size and requires considerably large installation space, involves a new problem that it becomes difficult to efficiently produce silicon single crystals.

Further, in the case of the employment of the superconductivity type magnetic field generating apparatus, for means for protecting human body from the dangerous magnetic field, it is considered to surround the magnetic field generating apparatus with a magnetic material to shield leakage magnetic field with use of the magnetic material. This structure however, as in the employment of the normal conductivity type, requires a large installation space and thus efficient production of silicon single crystals becomes difficult.

SUMMARY OF THE INVENTION

In view of the above respects in the prior art, it is therefore an object of the present invention to provide an equipment for producing silicon single crystals based on an MCZ method, which can prevent its increased size and protect a worker's body from dangerous magnetic field.

In accordance with the present invention, in order to solve the above problems in the prior art, there is provided an improved equipment for producing silicon single crystals based on the MCZ method which includes a pulling apparatus having a crucible containing silicon melt and an operation control apparatus for controlling the pulling apparatus, and wherein the array of the operation controller is improved, that is, the operation control apparatus is positioned away from the pulling apparatus by a suitable distance for safety of worker's body.

In accordance with an aspect of the present invention, there is provided an equipment for producing silicon single crystals which comprises a single crystal growth furnace, a magnetic-field generating apparatus provided outside of the single crystal growth furnace, a silicon single crystal pulling apparatus provided within the growth furnace, and an operation control apparatus for controlling operation of the pulling apparatus, wherein a silicon single crystal is pulled under control of the operation control apparatus during application of a magnetic field of the magnetic-field generating apparatus to silicon melt contained in a quartz crucible of the pulling apparatus, the operation control apparatus is disposed as spaced by a predetermined distance from the pulling apparatus to cause an intensity of the magnetic field immediately close to the operation control apparatus to be 300 gausses or less during pulling operation of the silicon single crystal.

In the equipment for producing silicon single crystals according to the present invention, the operation control apparatus has a monitor for monitoring an image indicative of a crystal growing condition observed by a monitoring camera for monitoring of an inside condition of the growth furnace, the monitor being a liquid crystal display, a plasma display or a cathode-ray tube (CRT) covered with an electromagnetic shield.

In the silicon single crystal production equipment of the present invention, the intensity of magnetic field to which the body of an operator of the operation control apparatus is exposed at a level of at most 300 gausses that is less than its allowable maximum magnetic field intensity of about 600 gausses, so that, even when the operator uses the operation control apparatus continuously for 8 hours the operator's body will not adversely be influenced by the magnetic field.

BRIEF DESCRIPTION OF THE DRAWINGS

FIG. 2 is a graph showing results of a test conducted for the equipment of FIG. 1.

DESCRIPTION OF THE PREFERRED EMBODIMENT

Figure 1:
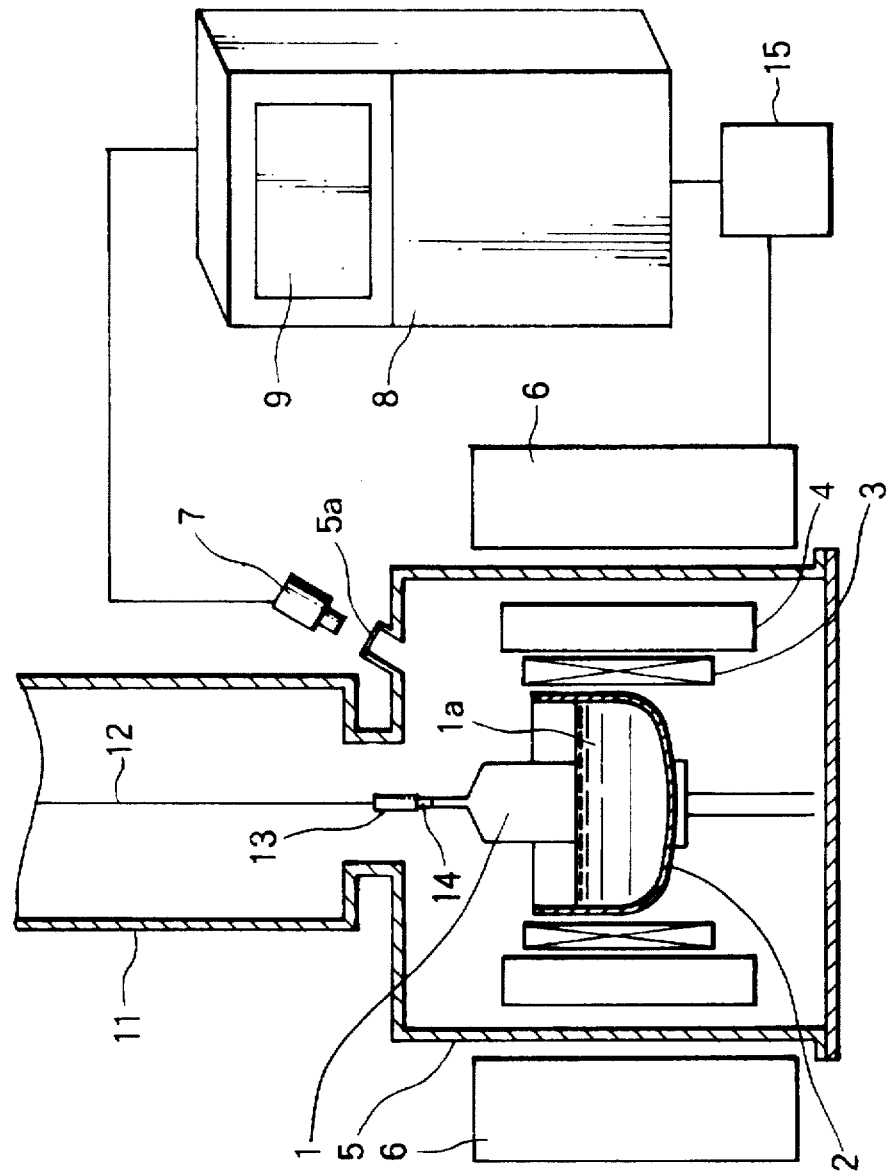
FIG. 1 schematically shows a structure of a major part of a silicon single crystals production equipment in accordance with an embodiment of the present invention.

An embodiment of the present invention will be detailed with reference to the accompanying drawings.

Embodiment 1:

FIG. 1 schematically shows a structure of a major part of an equipment for producing silicon single crystals which has a pulling apparatus shown in its vertical cross-sectional view and an operation control apparatus shown in its perspective view. In the illustrated equipment, a crucible 2 made of quartz is disposed inside a cylindrical growth furnace 5 to be rotated and moved up and down. Disposed around the crucible 2 is a cylindrical heater 3 for up and down movement. Disposed around the heater 3 is a cylindrical heat insulator 4.

Provided outside the growth furnace 5 and immediately close thereto is a magnetic-field generating apparatus 6 which has a superconducting magnet. The growth furnace 5 is provided at its upper part with a window 5a, to which a monitoring camera 7 of a charge-coupled device (CCD) type immune to magnetic field is located for observing the inside of the growth furnace 5. Provided in the upper part of the growth furnace 5 is a cylindrical pull chamber 11 as concentrically connected with the growth furnace 5, at which interconnection part an isolation valve (not shown) is disposed.

At the upper part of the pull chamber 11, a wire winding apparatus (not shown) for pulling a silicon single crystal is disposed rotatably around its vertical axis. Suspended from the wire winding apparatus is a wire 12 which is attached at its lower end with a seed crystal 14 by a seed holding jig 13. The pull chamber 11 is provided in its upper part with a port for supply of an inert gas such as Ar, while the growth furnace 5 is provided in its bottom with a port for exhausting the inert gas respectively (both ports being not illustrated). The above exhaust port is fluidically connected with a vacuum producer or supply source (not shown) so that a predetermined level of vacuum is kept within the growth furnace 5 and pull chamber 11. Reference numeral 1 denotes a growing single crystal, reference symbol 1a denotes silicon melt, and numeral 15 denotes a electric power supply.

A growth furnace control apparatus 8 is located a suitable distance away from the magnetic-field generating apparatus 6 of the silicon single crystal pulling apparatus arranged as mentioned above. The growth furnace control apparatus 8 has a monitor 9 which is operatively connected to the monitor 9 for observing an image on the crystal growing status monitored by the monitoring camera 7. The monitor 9 is desirably a liquid crystal display or a plasma display, from the viewpoint that these displays will suffer no color change nor distortion in images under the influences of magnetism. For the monitor 9, further, a cathode-ray tube (CRT) covered with an electromagnetic shield may be preferably employed. The reason is as follows. In the case of the silicon single crystal production equipment of the present invention, even when the monitor 9 is positioned away from the pulling apparatus by a considerable distance, a very weak magnetic field is still present in the monitor 9.

Thus, an ordinary cathode-ray tube (CRT) not covered with the electromagnetic shield produces color-changed or distorted images, which results in that it becomes difficult for an operator to correctly judge the image on the display screen of the monitor indicative of information on the inside condition of the equipment during the crystal pulling operation.

Upon production of a silicon single crystal, the magnetic-field generating apparatus 6 is activated and heating of the crucible 2 is started by means of the heater 3. Then such an inert gas as Ar is introduced into the growth furnace 5, the seed crystal 14 is brought into contact with a surface of the silicon melt 1a, the seed crystal 14 is rotated and pulled while the crucible 2 is rotated to thereby grow a silicon single crystal. During the growing operation, the operator monitors the inside condition of the growth furnace 5 on the display screen of the monitor 9 of the growth furnace control apparatus 8, and manipulates the growth furnace control apparatus 8 as necessary.

Since the above silicon single crystal production equipment is arranged so that the operator monitors the inside condition of the growth furnace 5 at such a safe location that the operator will not suffer the adverse influences of magnetic field and controls the pulling apparatus on a remote control basis, whereby the need for provision of a magnetic material around the magnetic-field generating apparatus 6 for shielding against any leakage magnetic field can be eliminated and therefore the production of the silicon single crystal can safely and efficiently realized.

Experimental Example 1:

Explanation will next be made as to an experiment conducted with use of the equipment of FIG. 1 to produce silicon single crystals. In the experiment, 150 kg of raw silicon was charged into the quartz crucible of 60 cm in inner diameter and a silicon single crystal having a diameter of 200 mm was produced. In this case, the intensity of a magnetic field applied to the silicon melt contained within the quartz crucible was set to be from about 4,000 to about 6,000 gausses, and the growth furnace control apparatus was installed at a position about 2 m away from the magnetic-field generating apparatus. In this connection, although the intensity of the magnetic field applied to the silicon melt varies with the position of the silicon melt, the intensity was set to be about 4,000 gausses at the axial center of the crucible and about 6,000 gausses in the vicinity of the inner peripheral surface of the crucible.

Detailed explanation will next be made as to the effects of the growth furnace control apparatus installed away from the pulling apparatus as mentioned above. The earlier-mentioned literature ACGIH states that, when a human body is exposed in a magnetic field, an accumulated magnetic field exposure reference value, i.e., a maximum of such an accumulated magnetic field exposure value that the human body will not suffer adverse influences by the magnetic field, is expressed by the following equation (1).

$$500 \text{ gausses} \times 7.6 \text{ hours} = 3{,}800 \text{ gausses/day} \tag{1}$$

This equation (1) means that, when a human body is continuously exposed to a magnetic field having an intensity of, e.g., 500 gausses, the human body does not suffer adverse influences for 7.6 hours or less, and the higher the intensity of the magnetic field is the more the allowable exposure time is limited. In this conjunction, an accumulated magnetic field exposure value when the human body is exposed to a magnetic field having an intensity of, e.g., 50 gausses continuously for 7.6 hours is 10% of the above maximum, and an accumulated magnetic field exposure value when the human body is exposed to a magnetic field having an intensity of 100 gausses continuously for 7.6 hours is 20% of the above maximum.

Under the above conditions, the production of the silicon single crystals was continued for about 30 days. For these days, the intensity of the magnetic field immediately close to the growth furnace control apparatus was able to be set to be about 50 gausses. Further, a percentage (%) to the accumulated magnetic field exposure reference value (corresponding to 8-hour exposure per person) is as shown in FIG. 2. That is, the above percentage was able to be suppressed to less than 20% in all pulling batches. This means that, even when the production of the silicon single crystals was conducted based on the MCZ method continuously for about 30 days, the operator was not susceptible to any adverse influences caused by the magnetic field and was able to conduct highly safe operations.

The term "percentage (%) to the accumulated magnetic field exposure reference value" as used in FIG. 2 indicates a passage of the accumulated magnetic field exposure time per person and per day when the production of the silicon single crystals was actually continued for about 30 days. In other words, the accumulated magnetic field exposure time per day is divided by 3,800 gausses as the above accumulated magnetic field exposure reference value and then multiplied by 100, which resultant value is shown by a graph in FIG. 2. A wide range of variations in the data are observed in FIG. 2. This is because the production of the silicon single crystals is conducted on a batch basis, that is, such a step that no magnetic field is applied after completion of one batch for preparation of the next batch is included in the about-30-day production period.

As will be seen from the above disclosure, in accordance with the present invention, there is provided an equipment for producing silicon single crystals based on the MCZ method, wherein the operation control apparatus for controlling the operation of the pulling apparatus is located away from the pulling apparatus by a suitable distance, the intensity of magnetic field immediately close to the operation control apparatus is made to be much lower than the magnetic field intensity in the vicinity of the pulling apparatus, whereby the body of the operator controlling the pulling apparatus can be protected from the dangerous exposure to the magnetic field, the production operation of the silicon single crystals can be implemented safely and efficiently without involving increase in the size of the silicon single crystal production equipment, to advantage.

What is claimed is:

1. An equipment for producing silicon single crystals wherein a magnetic-field generating apparatus is provided outside of a single crystal growth furnace to form a silicon single crystal pulling apparatus, an opeerator controlled operation control apparatus is provided for controlling operation of said pulling apparatus, a silicon single crystal is pulled under control of said operation control apparatus during application of a magnetic field of said magnetic-field generating apparatus to silicon melt contained in a quartz crucible of said pulling apparatus; characterized in that said operation control apparatus is disposed as spaced by a distance from said pulling apparatus to cause an intensity of the magnetic field immediately close to said operation control apparatus to be 300 gausses or less during pulling operation of the silicon single crystal.

2. An equipment for producing silicon single crystals as set forth in claim 1, wherein said operation control apparatus has a monitor for monitoring an image indicative of a crystal growing condition observed by a monitoring camera for monitoring of an inside condition of said growth furnace, said monitor being a liquid crystal display, a plasma display or a cathode-ray tube (CRT) covered with an electromagnetic shield.

* * * * *